(12) United States Patent
Ookubo et al.

(10) Patent No.: US 12,446,346 B2
(45) Date of Patent: Oct. 14, 2025

(54) PHOTOELECTRIC CONVERSION ELEMENT, IMAGE SENSING DEVICE, AND IMAGING SYSTEM

(71) Applicant: TOPPAN Inc., Tokyo (JP)

(72) Inventors: Yu Ookubo, Taito-ku (JP); Tomohiro Nakagome, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 906 days.

(21) Appl. No.: 17/678,304

(22) Filed: Feb. 23, 2022

(65) Prior Publication Data

US 2022/0278155 A1    Sep. 1, 2022

Related U.S. Application Data

(63) Continuation of application No. PCT/JP2020/032568, filed on Aug. 28, 2020.

(30) Foreign Application Priority Data

Aug. 30, 2019  (JP) ................................ 2019-157643

(51) Int. Cl.
*G01S 17/894* (2020.01)
*G01S 7/481* (2006.01)
(Continued)

(52) U.S. Cl.
CPC ........ *H10F 39/8063* (2025.01); *G01S 7/4816* (2013.01); *G01S 7/4863* (2013.01); (Continued)

(58) Field of Classification Search
CPC ............... H10F 39/8063; H10F 39/184; H10F 39/8057; H10F 39/12; H10F 39/8023; (Continued)

(56) References Cited

U.S. PATENT DOCUMENTS

| 8,937,711 B2 | 1/2015 | Kim et al. |
| 2011/0199602 A1 | 8/2011 | Kim et al. |
| 2018/0211990 A1* | 7/2018 | Yorikado ............... H04N 25/76 |

FOREIGN PATENT DOCUMENTS

JP            6001236 B2    10/2016

OTHER PUBLICATIONS

International Search Report issued Nov. 17, 2020 in PCT/JP2020/032568, filed Aug. 28, 2020, 5 pages (with English Translation).

* cited by examiner

*Primary Examiner* — David P Porta
*Assistant Examiner* — Mamadou Faye
(74) *Attorney, Agent, or Firm* — Oblon, McClelland, Maier & Neustadt, L.L.P.

(57) ABSTRACT

A photoelectric conversion element includes a substrate and an optical element. The substrate has a first surface on which reflected light reflected from an object is incident, and includes a first semiconductor region and a second semiconductor region, the second semiconductor region being formed in a direction perpendicular to the first surface and extended from the first surface toward an inside of the substrate. The optical element is positioned on a first surface side of the substrate and collects the reflected light to the second semiconductor region. The first semiconductor region includes a first conductive type semiconductor, the second semiconductor region includes a second conductive type semiconductor. The substrate and the optical element are structured such that a relational expression $0.95*\exp(-\alpha(\lambda)*z) \leq B(z)/A1 \leq 1.05*\exp(-\alpha(\lambda)*z)$ is established at a distance $z=z0$ when $A1 \geq A2$ is satisfied and a distance $z0=\ln(2)/\alpha(\lambda)$ is established.

16 Claims, 8 Drawing Sheets

(51) Int. Cl.
  *G01S 7/4863* (2020.01)
  *G02B 3/00* (2006.01)
  *H10F 39/00* (2025.01)
  *H10F 39/18* (2025.01)

(52) U.S. Cl.
  CPC .......... *G01S 17/894* (2020.01); *G02B 3/0037* (2013.01); *H10F 39/184* (2025.01); *H10F 39/8057* (2025.01)

(58) Field of Classification Search
  CPC .. H10F 39/8067; G01S 7/4816; G01S 7/4863; G01S 17/894; G02B 3/0037; G02B 19/0014; G02B 19/0076; H04N 25/70; H04N 25/75
  See application file for complete search history.

PHOTOELECTRIC CONVERSION ELEMENT, IMAGE SENSING DEVICE, AND IMAGING SYSTEM

CROSS-REFERENCE TO RELATED APPLICATIONS

The present application is a continuation of International Application No. PCT/JP2020/032568, filed Aug. 28, 2020, which is based upon and claims the benefits of priority to Japanese Application No. 2019-157643, filed Aug. 30, 2019. The entire contents of all of the above applications are incorporated herein by reference.

BACKGROUND OF THE INVENTION

Field of the Invention

The present invention relates to photoelectric conversion elements, image sensing devices in which the photoelectric conversion elements are arranged, and imaging systems provided with the image sensing devices.

Discussion of the Background

As techniques for measuring a distance to an object, there has been known a technique in which an object is irradiated with optical pulses in the near infrared region, and a time difference is measured between the time when the optical pulses were emitted and the time when the light reflected by the object irradiated with the optical pulses was detected, that is, a flight time of the optical pulses is measured. The technique in which a distance to an object is measured as a flight time of optical pulses is called a time-of-flight (TOF) technique. Furthermore, distance measuring sensors which measure a distance to an object based on the time-of-flight technique using photoelectric conversion elements have also been put into practical use.

Furthermore, in recent years, as a result of developing the configuration for measuring a distance to an object based on the time-of-flight technique using photoelectric conversion elements, distance measuring sensors capable of not only measuring a distance to an object but also obtaining a two-dimensional image including the object, i.e., obtaining three-dimensional information for the object, have also been put into practical use. Such distance measuring sensors are also called range imaging sensors. In a range imaging sensor, a plurality of pixels, each of which includes a photodiode as a light-receiving unit for receiving the light of optical pulses reflected by an object, are two-dimensionally arranged in a matrix on a silicon substrate. Such a range imaging sensor causes the plurality of pixels to output photoelectric conversion signals corresponding to one image, which are based on the amount of reflected light of the optical pulses received by these pixels, to thereby obtain a two-dimensional image including the object and distance information obtained by each of the plurality of pixels configuring the image. Thus, range imaging sensors can obtain three-dimensional information that is a combination of a two-dimensional image including the object and distance information obtained by the plurality of pixels.

The accuracy of a distance that can be measured by a range imaging sensor depends on the amount of reflected light of optical pulses, which can be received by the plurality of pixels at the same time. Specifically, range imaging sensors can measure a distance with higher accuracy if the plurality of pixels are able to receive a larger amount of reflected light at the same time. Therefore, range imaging sensors are preferred to increase the amount of reflected light of optical pulses that can be received by each of the plurality of pixels, i.e., to improve sensitivity of each of the plurality of pixels to light in the near infrared region.

It should be noted that, as disclosed in PTL 1, for example, several techniques have been proposed for improving sensitivity to light in image sensors that acquire images. In the technique disclosed in PTL 1, a plurality of microlenses are formed on respective pairs of photogates configuring respective sensor units (pixels) that are formed on a semiconductor substrate of a sensor system. Thus, sensor systems, to which the technique as disclosed in PTL 1 is applied, can increase the light-receiving area of an array and thus can increase sensitivity of the sensor systems. In this regard, range imaging sensors may also adopt the technique of having microlenses as disclosed in PTL 1 to improve sensitivity of each of the plurality of pixels to light in the near infrared region.

PTL 1: JP 6001236 B

SUMMARY OF THE INVENTION

According to an aspect of the present invention, a photoelectric conversion element includes a substrate and an optical element. The substrate has a first surface on which reflected light reflected from an object is incident, and includes a first semiconductor region and a second semiconductor region, the second semiconductor region being formed in a direction perpendicular to the first surface and extended from the first surface toward an inside of the substrate. The optical element is positioned on a first surface side of the substrate and collects the reflected light to the second semiconductor region. The first semiconductor region includes a first conductive type semiconductor, the second semiconductor region includes a second conductive type semiconductor. The substrate and the optical element are structured such that a relational expression $0.95*\exp(-\alpha(\lambda)*z) \le B(z)/A1 \le 1.05*\exp(-\alpha(\lambda)*z)$ is established at a distance $z=z0$ when $A1 \ge A2$ is satisfied and a distance $z0=\ln(2)/\alpha(\lambda)$ is established, where I is incident energy of the reflected light incident on the photoelectric conversion element, $\alpha(\lambda)$ is an absorption coefficient of the reflected light in the substrate where $\lambda$ is an average wavelength of a light source, A1 is incident energy of the reflected light in a predetermined region on the first surface, A2 is incident energy of the reflected light in the predetermined region on the first surface in a case where the photoelectric conversion element does not include the optical element, and B(z) is incident energy of the reflected light in a region translated from the predetermined region by a predetermined distance z in a thickness direction of the substrate.

According to another aspect of the present invention, a photoelectric conversion element includes a substrate and an optical element. The substrate has a first surface on which reflected light reflected from an object is incident, and includes a first semiconductor region and a second semiconductor region, the second semiconductor region being formed in a direction perpendicular to the first surface and extended from the first surface toward an inside of the substrate. The optical element is positioned on a first surface side of the substrate and collects the reflected light to the second semiconductor region. The first semiconductor region includes a first conductive type semiconductor, the second semiconductor region includes a second conductive type semiconductor. The substrate and the optical element are structured such that a relational expression $0.95*\exp(-$ α(λ)*z)≤B(z)/A1≤1.05*exp(−α(λ)*z) is established at a distance z satisfying 0≤z≤z0 when A1≥A2 is satisfied and a distance z0=ln(2)/α(λ) is established, where I is incident energy of the reflected light incident on the photoelectric conversion element, α(λ) is an absorption coefficient of the reflected light in the substrate where λ is an average wavelength of a light source, A1 is incident energy of the reflected light in a predetermined region on the first surface, A2 is incident energy of the reflected light in the predetermined region on the first surface in a case where the photoelectric conversion element does not include the optical element, and B(z) is incident energy of the reflected light in a region translated from the predetermined region by a predetermined distance z in a thickness direction of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
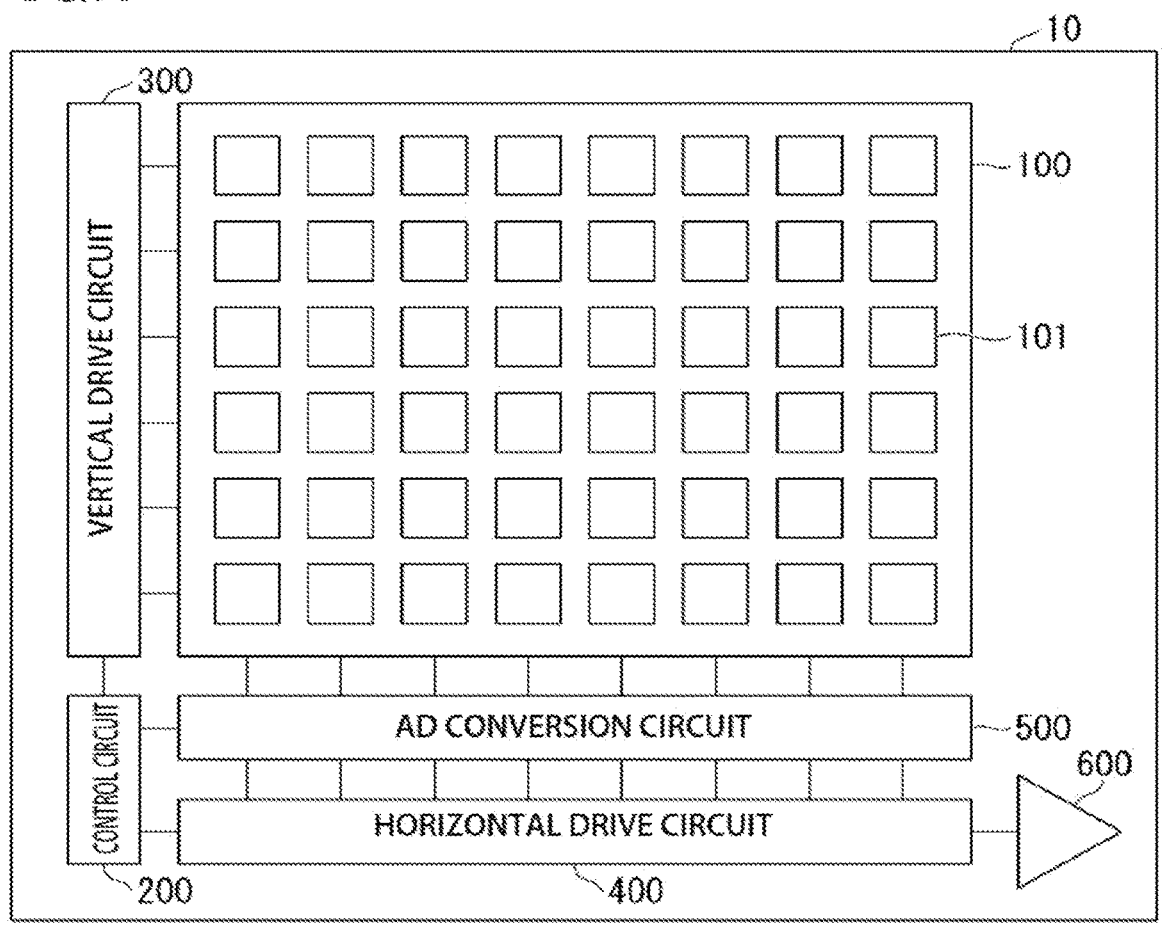
FIG. 1 is a schematic block diagram illustrating an overall configuration of an image sensing device according to an embodiment of the present invention.

The embodiments will now be described with reference to the accompanying drawings, wherein like reference numerals designate corresponding or identical elements throughout the various drawings.

With reference to the drawing, some embodiments of the present invention will be described.

A photoelectric conversion element according to an embodiment of the present invention is a pixel including a silicon substrate (substrate), a wiring layer W, and a microlens (optical element). Inside the silicon substrate, a photodiode serving as a photoelectric conversion unit is provided.

The photoelectric conversion element (pixel) is provided to an imaging system according to an embodiment of the present invention which measures a distance to an object using a time-of-flight (TOF) technique. Furthermore, the photoelectric conversion element (pixel) is formed in a range imaging sensor that is an image sensing device according to an embodiment of the present invention. Specifically, the following description deals with a photoelectric conversion element according to an embodiment of the present invention which is formed in an image sensing device (range imaging sensor) according to an embodiment of the present invention. The range imaging sensor receives light having a long wavelength in the near infrared wavelength band (e.g., light in a wavelength band of 850 nm to 940 nm) emitted from an imaging system according to an embodiment of the present invention to output a signal for measuring a distance to the object.

FIG. 1 is a schematic block diagram illustrating an overall configuration of the image sensing device according to an embodiment of the present invention. FIG. 1 shows a range imaging sensor 10 including a light-receiving region 100 where a plurality of pixels 101 (pixel array) are arranged, a control circuit 200, a vertical drive circuit 300, a horizontal drive circuit 400, an AD conversion circuit 500, and an output circuit 600. The range imaging sensor 10 shown in FIG. 1 shows an example of the light-receiving region 100 where a plurality of pixels 101 are two-dimensionally arranged in a 6-row and 8-column matrix to form an array of pixels. In other words, the plurality of pixels 101 configuring the pixel array that configures the range imaging sensor 10 are arrayed in a first direction and a second direction which are orthogonal to each other.

The control circuit 200 controls components, such as the vertical drive circuit 300, the horizontal drive circuit 400 and the AD conversion circuit 500, provided to the range imaging sensor 10. The control circuit 200 controls, for example, the operation of the components of the range imaging sensor 10 according to the control from a control unit, not shown, provided to the imaging system.

The vertical drive circuit 300 controls the plurality of pixels 101 arranged in the light-receiving region 100 according to the control from the control circuit 200. According to the driving of the vertical drive circuit 300, the plurality of pixels 101 photoelectrically convert light incident thereon (incident light) and generate signal charge. The vertical drive circuit 300 causes a pixel signal of each of the plurality of pixels 101, according to the signal charge, to be outputted (read out) to a corresponding one of vertical signal lines. The vertical drive circuit 300 outputs a drive signal for driving (controlling) the pixels 101, for each row of pixels 101 arranged in the light-receiving region 100. Thus, the pixel signals outputted from the pixels 101 are read out for each row to the vertical signal lines and outputted to the AD conversion circuit 500.

Each pixel 101 arranged in the light-receiving region 100 outputs a pixel signal that is an electrical signal converted from incident light. The pixel 101 is configured to include components such as a photodiode (photoelectric conversion unit) that generates signal charge according to the amount of incident light (light intensity) and stores the signal charge therein to convert the incident light into an electrical signal. In response to the drive signal inputted from the vertical drive circuit 300, each of the plurality of pixels 101 outputs a pixel signal corresponding to the amount of incident light (light intensity) to a corresponding one of the vertical signal lines. It should be noted that a detailed description related to the structure of the pixel 101 will be given later.

The AD conversion circuit 500 is an analog/digital conversion circuit that converts analog pixel signals outputted from the pixels of each column to a corresponding one of the vertical signal lines, into digital values representing the magnitudes of the pixel signals, according to the control from the control circuit 200. It should be noted that the AD conversion circuit 500 may be a group of multiple AD conversion circuits corresponding to the plurality of columns of pixels 101 arranged in the light-receiving region 100. The AD conversion circuit 500 outputs the pixel signals obtained through analog/digital conversion to the horizontal signal line as output signals according to the control from the horizontal drive circuit 400.

The horizontal drive circuit 400 sequentially causes the pixel signals (output signals) after analog/digital conversion to be outputted (read out) to the horizontal signal line. Specifically, due to the driving of the horizontal drive circuit 400, the pixel signals corresponding to individual columns of the pixels 101 arranged in the light-receiving region 100, which have been subjected to analog/digital conversion and outputted from the AD conversion circuit 500, are sequentially outputted to the horizontal signal line according to the control from the control circuit 200. The horizontal drive circuit 400 sequentially outputs control signals for causing the output signals corresponding to the pixels 101 in individual columns to be outputted to the AD conversion circuit 500. Thus, the output signals outputted from the AD conversion circuit 500 are sequentially outputted to the output circuit 600 via the horizontal signal line.

The output circuit 600 outputs the output signals from the AD conversion circuit 500, which have been outputted to the horizontal signal line by the horizontal drive circuit 400, to the outside of the range imaging sensor 10. The output circuit 600 may be, for example, an output amplifier, or the like.

Figure 2:
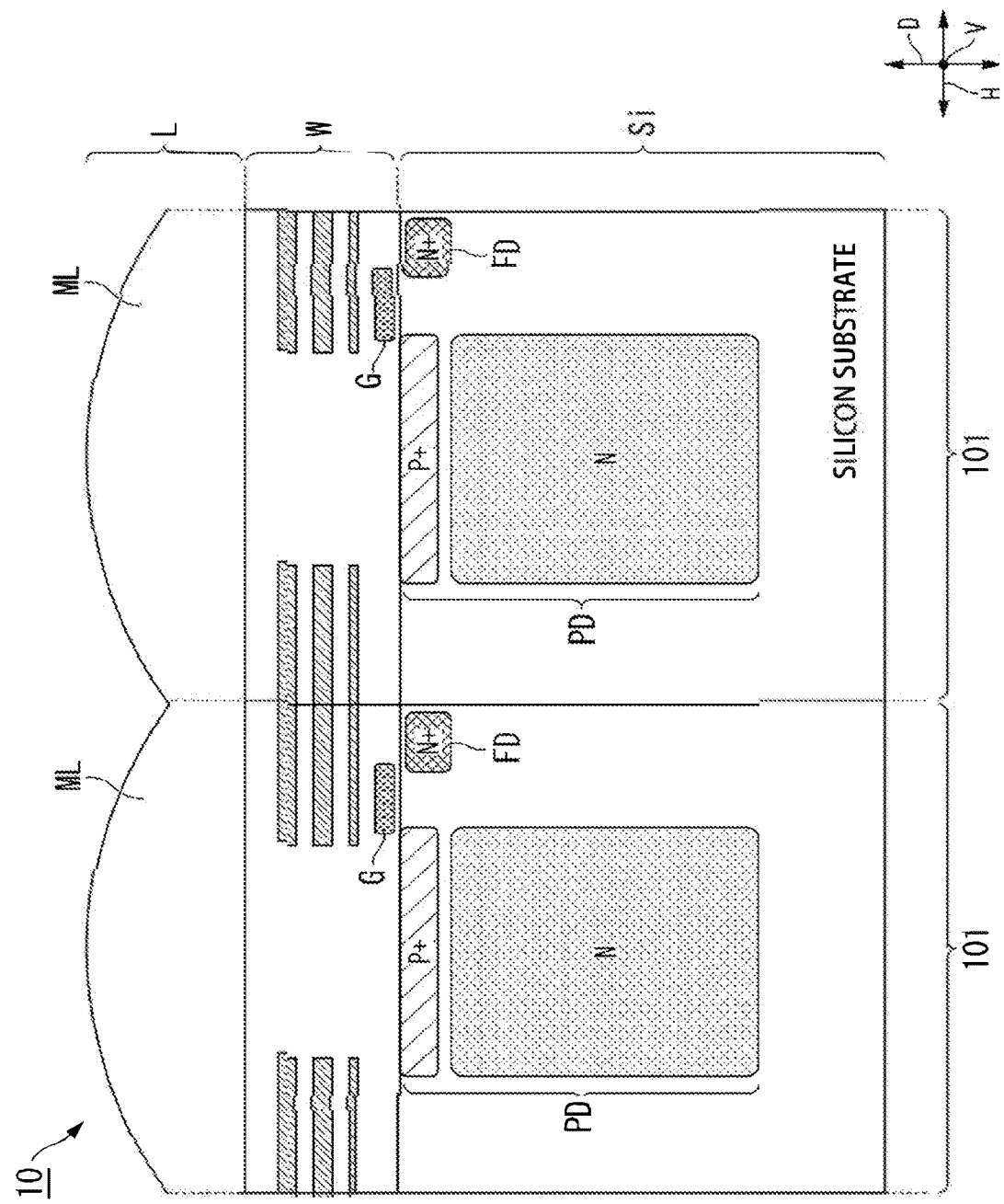
FIG. 2 is a schematic cross-sectional view illustrating a configuration of a cross section of an image sensing device in which photoelectric conversion elements according to an embodiment of the present invention are formed.

Next, a description will be given of a structure of a semiconductor substrate that configures a pixel 101 arranged in the light-receiving region 100 of the range imaging sensor 10. FIG. 2 is a schematic cross-sectional view illustrating a cross section of an image sensing device (range imaging sensor 10) in which photoelectric conversion elements according to an embodiment of the present invention are formed. In the range imaging sensor 10, a plurality of pixels 101 including respective photoelectric conversion elements of the present invention are two-dimensionally arranged in a matrix in the light-receiving region 100 formed in the semiconductor substrate of the range imaging sensor 10. FIG. 2 schematically illustrates an example of a cross section of the semiconductor substrate corresponding to a region of two adjacent pixels in the lateral direction (horizontal direction H) as viewed in a direction in which light is incident on the light-receiving region 100 of the range imaging sensor 10. The pixels 101 are each configured to include at least a photodiode PD, a floating diffusion FD, and a gate electrode G.

The photodiode PD is an embedded type photodiode which generates and stores signal charge corresponding to the amount of incident light (light intensity). The gate electrode G is an electrode to have a potential applied thereto from outside the pixel 101, which is required for transferring the signal charge generated and stored by the photodiode PD to the floating diffusion FD. The gate electrode G serves as a shutter for the photodiode PD that receives incident light. The floating diffusion FD is a charge storage capacitor that stores the signal charge transferred by the gate electrode G. In the range imaging sensor 10, the signal charge stored in the floating diffusion FD of each of the plurality of pixels 101 is read out as a pixel signal into the AD conversion circuit 500.

The configuration of the range imaging sensor 10 shown in FIG. 2, when compared to generally used image sensors, has a structure corresponding to that of a frontside illumination (FSI) type image sensor. Therefore, the range imaging sensor 10 shown in FIG. 2 includes a silicon substrate Si (substrate) that is a semiconductor substrate configured by a first conductive type semiconductor (P type semiconductor) serving as the range imaging sensor 10. The plurality of components including the photodiode PD configuring the pixel 101 are formed on a light incident side of the silicon substrate Si, i.e., the front surface side of the silicon substrate Si. More specifically, as shown in FIG. 2, the photodiode PD (photoelectric conversion unit) configuring the pixel 101 is formed from the front surface (termed first surface hereinafter) of the silicon substrate Si. As shown in FIG. 2, the silicon substrate Si includes the first surface, a first semiconductor region configured by the first conductive type semiconductor (P+ type semiconductor), and a second semiconductor region configured by a second conductive type semiconductor (N type semiconductor) whose conductive type is different from that of the first conductive type semiconductor. These elements form the photodiode PD having a configuration with which electrons corresponding to the incident light (light intensity) are generated and stored as signal charge. The photodiode PD having the configuration shown in FIG. 2 is achieved by forming an N type semiconductor region (second semiconductor region) by doping impurities that serve as the second conductive type semiconductor (N type semiconductor) into the silicon substrate Si and then forming a P+ type semiconductor region by doping impurities that serve as the first conductive type semiconductor (P+ type semiconductor) into the silicon substrate Si. Specifically, the second semiconductor region is formed so as to extend toward the inside of the silicon substrate Si in the direction perpendicular to the first surface. Inside the silicon substrate Si, the second semiconductor region is enclosed by the first semiconductor region.

It should be noted that the floating diffusion FD shown in FIG. 2 is formed when forming the photodiode PD. In FIG. 2, the floating diffusion FD as an N+ type semiconductor is formed at the first surface of the silicon substrate Si.

After that, as shown in FIG. 2, a wiring layer W including the gate electrode G is formed on the first surface of the silicon substrate Si in which the photodiode PD has been formed. FIG. 2 shows a wiring layer W in which four-layer wiring is formed. The plurality of wirings formed in the wiring layer W are formed of polysilicon (poly-Si) or aluminum (Al). The gate electrode G shown in FIG. 2 may be, for example, a polysilicon gate electrode formed of polysilicon. Other wirings shown in FIG. 2 may be formed, for example, of aluminum and are connected to other components configuring the pixel 101 or to circuit elements, not shown, formed in the range imaging sensor 10.

After that, as shown in FIG. 2, a microlens ML that is an optical element collecting incident light to the photodiode PD is formed on a microlens layer L which is formed on a front surface side of the wiring layer W, i.e., a light incident surface (front surface, first surface) thereof, through which light enters the range imaging sensor 10. It should be noted that, in the range imaging sensor 10, microlenses ML are formed at positions corresponding to the photodiodes PD that configure the respective pixels 101.

In the example shown in FIG. 2, two adjacent pixels 101, i.e., a first pixel and a second pixel, are illustrated. The first and second pixels are provided with respective microlenses ML. In this structure, two adjacent microlenses ML, i.e., a first microlens and a second microlens, are formed.

In this case, as shown in FIG. 2, the microlenses ML are formed in the range imaging sensor 10 so that no gap is formed between the microlenses ML corresponding to the adjacent pixels, that is, so that the lens gap will be zero. However, methods of forming the microlenses ML may include methods with which the lens gap cannot be reduced to zero. If the microlenses ML are formed in the range imaging sensor 10 using a method with which the lens gap cannot be reduced to zero, the height of a first trough between two adjacent microlenses ML may be made different from the height of a second trough between two adjacent microlenses ML.

The height of trough refers to a distance from a surface between the wiring layer W and the microlens ML to the lowest level of the trough.

Specifically, when the microlenses ML are cut along a first direction and a second direction (directions orthogonal to each other, or a vertical direction V and a horizontal direction H) along which the plurality of pixels 101 are arrayed in the pixel array shown in FIG. 1, the height of trough between two adjacent microlenses ML is defined to be a height H1 (first height).

On the other hand, when the microlenses ML are cut along the direction that forms an angle of 45° with respect to the first and second directions along which the plurality of pixels 101 are arrayed, i.e., cut along the diagonal line direction of the pixels 101, the height of trough between two adjacent microlenses ML is defined to be a height H2 (second height). In this case, the heights H1 and H2 are made different from each other so that the height H1 will be higher than the height H2.

The configuration described above for the pixels 101 can be said to be a configuration similar to those of generally used front side illumination type image sensors. In other words, the pixels 101 can be produced through processes similar to those for generally used front side illumination type image sensors. However, in the range imaging sensor 10, the light incident on the photodiodes PD configuring the respective pixels 101 has a long wavelength in the near infrared wavelength band. Therefore, in the range imaging sensor 10, the light in the near infrared wavelength band incident on the plurality of pixels 101 reaches positions deep in the silicon substrate Si, i.e., long distant (far) positions therein in the optical axis direction of the light in the near infrared wavelength band collected by the microlenses ML. Accordingly, in the range imaging sensor 10, the photodiodes PD configuring the respective pixels 101 can generate electrons in response to light in the near infrared wavelength band even in regions located at deep positions.

Figure 3:
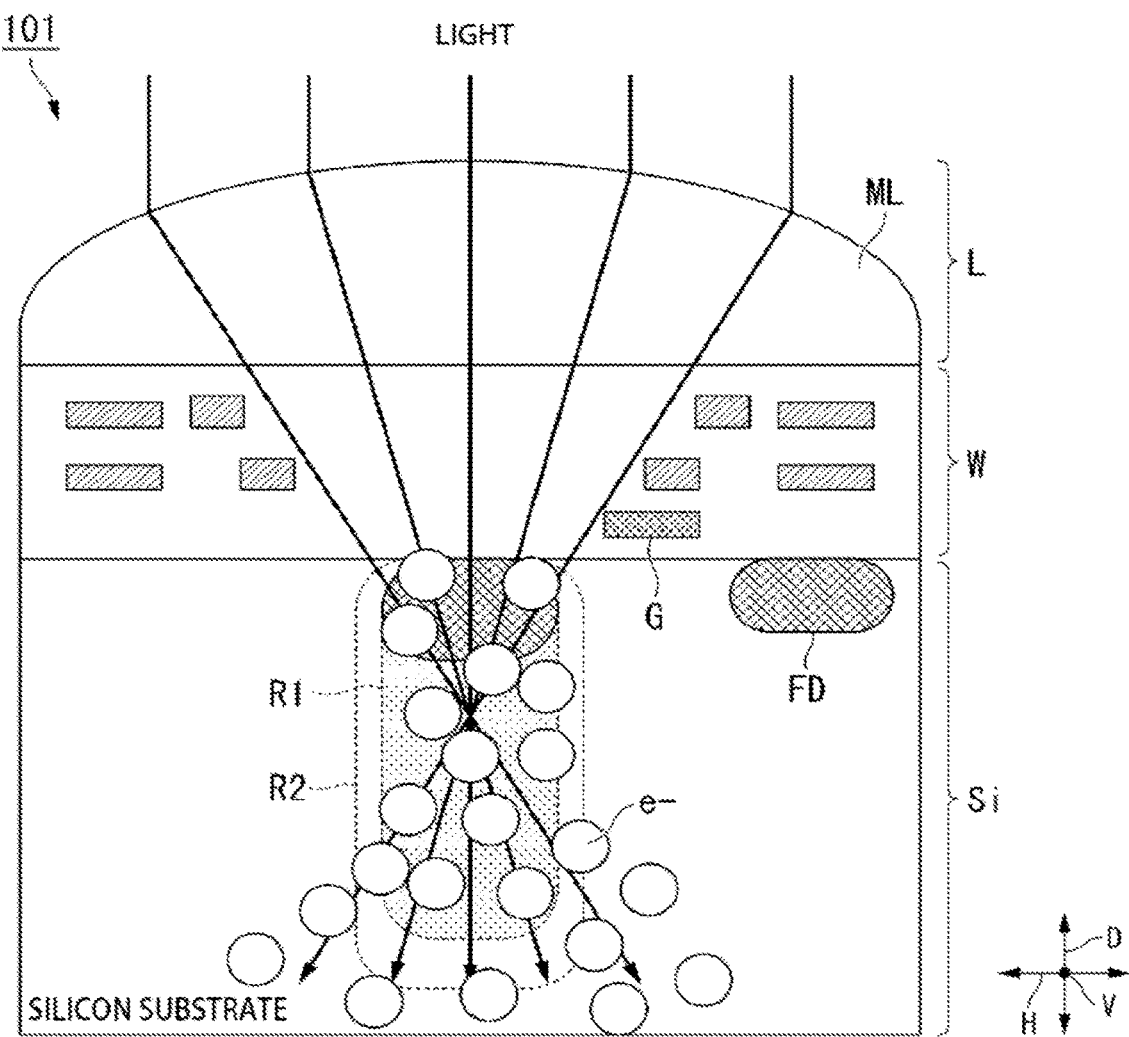
FIG. 3 is a cross-sectional view illustrating a pixel in a state where electrons are generated in response to light incident on an image sensing device in which a photoelectric conversion element according to an embodiment of the present invention is formed.

FIG. 3 is a cross-sectional view illustrating a pixel 101 in a state where electrons are generated in response to light (light in the near infrared wavelength band) incident on an image sensing device (range imaging sensor 10) in which the photoelectric conversion elements (pixels 101) according to an embodiment of the present invention are formed. FIG. 3 schematically illustrates a state where electrons e⁻ are generated in the silicon substrate Si of one pixel 101 arranged in the range imaging sensor 10 in response to light in the near infrared wavelength band, in the case where parallel light (so called collimated light) in the near infrared wavelength band is incident on the microlens ML. In the range imaging sensor 10, the electrons e⁻ according to the light in the near infrared wavelength band are generated even in a region located at a position deep in the silicon substrate Si, as shown in FIG. 3, in each of the plurality of pixels 101. Therefore, in the range imaging sensor 10, the structure of the photodiode PD configuring the pixel 101 is made suitable for light in the near infrared wavelength band. More specifically, the N type semiconductor region in the silicon substrate Si extending in the depth direction thereof, i.e., in a thickness direction D from the front surface (first surface) of the silicon substrate Si toward the rear surface thereof, is formed so as to extend deeper than the N type semiconductor region of the photodiode PD formed in a pixel of generally used front side illumination type image sensors. In other words, in the direction perpendicular to the front surface of the silicon substrate Si, the N type semiconductor region is formed in a portion of the silicon substrate Si so as to extend from the front surface toward the inside of the silicon substrate Si.

FIG. 3 shows that a range R1 in which the N type semiconductor region extends is further extended, in the thickness direction D, to a range R2. It should be noted that FIG. 3 shows that the range R2 of the N type semiconductor region is also extended in the lateral direction (horizontal direction H). Thus, in the range imaging sensor 10, each of the plurality of pixels 101 can also transfer the electrons e⁻, which are generated by the photodiode PD at positions deep in the silicon substrate Si in response to the light in the near infrared wavelength band incident on the pixel, to the floating diffusion FD for storage therein as signal charge generated by the photodiode PD. In this way, in the range imaging sensor 10, sensitivity of each pixel 101 to light in the near infrared wavelength band can be improved. In other words, the range imaging sensor 10 is able to output pixel signals having larger values.

Therefore, in the range imaging sensor 10, doping control for impurities serving as an N type semiconductor, which is performed when forming the photodiodes PD configuring the respective pixels 101, is made different from the doping control performed for generally used front side illumination type image sensors.

<Concepts>

Figure 4:
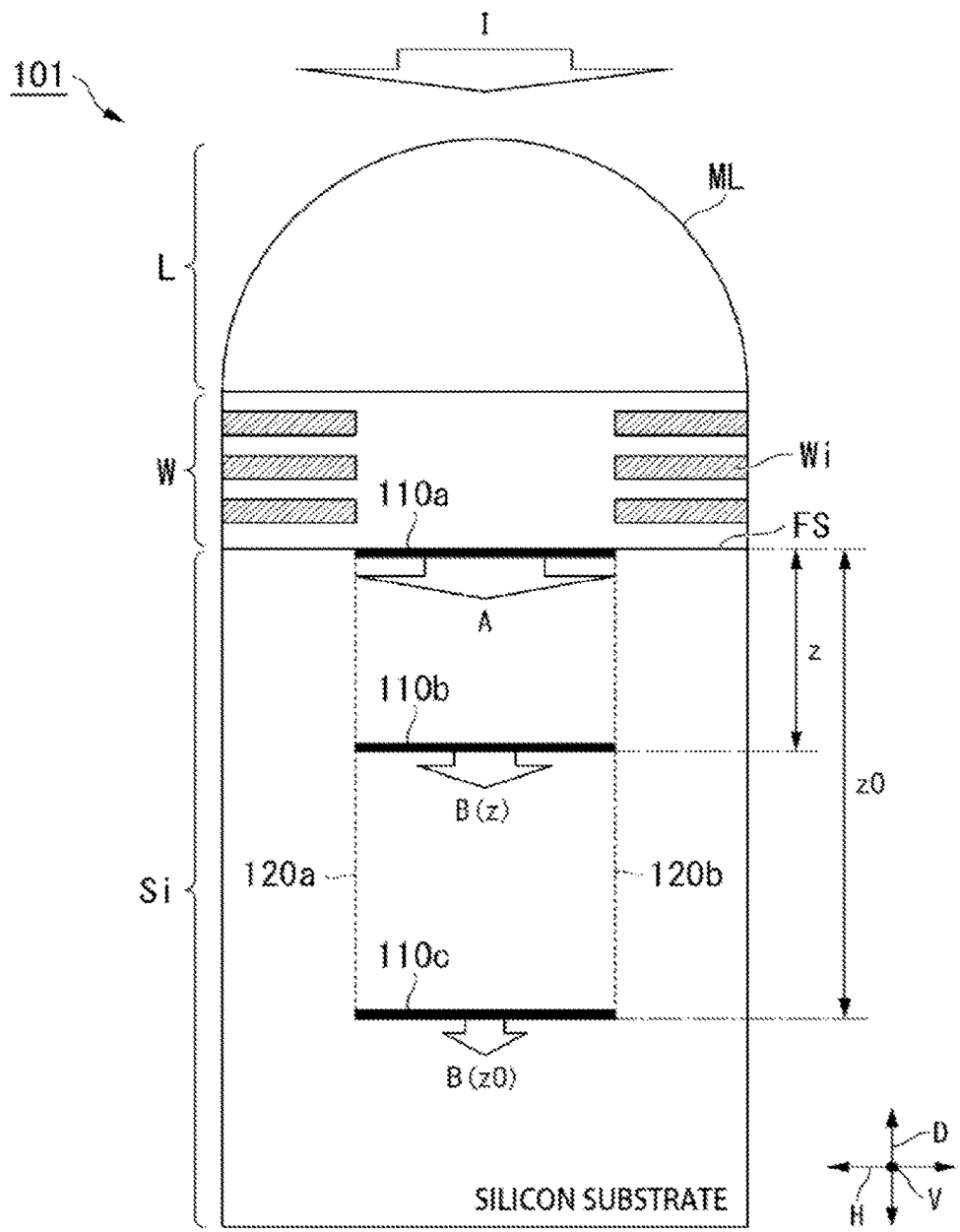
FIG. 4 is a schematic cross-sectional view illustrating concepts of forming a photoelectric conversion element according to an embodiment of the present invention.

Hereinafter, the concepts of forming the photodiode PD configuring each of the plurality of pixels 101 in the range imaging sensor 10 will be described. More specifically, a description will be given of the concepts of doping control for impurities that become an N type semiconductor, which is performed when forming the photodiode PD configuring each of the plurality of pixels 101 in the range imaging sensor 10. FIG. 4 is a cross-sectional view illustrating a pixel 101 to schematically show the concepts of forming a photoelectric conversion element (pixel 101) according to an embodiment of the present invention.

In the concepts of forming the photodiode PD in the range imaging sensor 10, doping control for impurities serving as an N type semiconductor is performed based on a ratio B/A, where A represents a light intensity in a predetermined region (first region) in the first surface of the silicon substrate Si on which light is incident, and B represents a light intensity in a predetermined region (second region) at a position away from the first surface by a predetermined distance in the thickness direction D (depth direction of the silicon substrate Si).

Specifically, the incident energy (intensity) of reflected light in the region (second region) translated from the predetermined region (first region) by a predetermined distance z in the thickness direction of the silicon substrate Si is defined to be B(z). Then, doping control for impurities serving as an N type semiconductor is performed based on a ratio B(z)/A that is a ratio between the light intensity A and the light intensity B(z).

In other words, in the concepts of forming the photodiode PD of the range imaging sensor 10, the depth of the N type semiconductor region in the photodiode PD is controlled based on the attenuation rate of light incident on the photodiode PD.

Furthermore, the predetermined region refers to a region defined by perpendicularly projecting the second semiconductor region to the first surface.

More specifically, as shown in FIG. 4, the incident energy of reflected light incident on the photodiode PD is defined to be I, the average wavelength of the light source, not shown, is defined to be $\lambda$, the absorption coefficient of the reflected light in the silicon substrate Si is defined to be $\alpha(\lambda)$, the incident energy of the reflected light in the predetermined region on the first surface is defined to be A, and the incident energy of the reflected light in the predetermined region away from the first surface by the predetermined distance z in the thickness direction D of the silicon substrate Si is defined to be B(z). Doping control for impurities serving as an N type semiconductor is performed so that, when a predetermined distance z0 from the first surface in the thickness direction D of the silicon substrate Si is defined as expressed by the following Formula (1), the relationships expressed by the following Formulas (2) and (3) can be established.

$$z0 = ln(2)/\alpha(\lambda) \quad (1)$$

$$A \geq 0.5 * I \quad (2)$$

$$\forall z[0 \leq z \leq z0 \Rightarrow 0.95 * \exp(-\alpha(\lambda) * z) \leq B(z)/A \leq 1.05 * \exp(-\alpha(\lambda) * z)] \quad (3)$$

It should be noted that the average wavelength of the light source is defined by the following Formula (4).

⟨Math. 1⟩

$$\bar{\lambda} = \frac{\int_{\lambda_0 - \Lambda}^{\lambda_0 + \Lambda} \lambda \cdot I(\lambda) d\lambda}{\int_{\lambda_0 - \Lambda}^{\lambda_0 + \Lambda} I(\lambda) d\lambda} \quad (4)$$

where, $I(\lambda)$ is the light source intensity distribution.

$\lambda_0$ is the peak wavelength of the light source intensity.

$\Lambda$ is the wavelength range set to, for example, 10 nm for calculating an average value.

Next, the conditions mentioned above will be described. In FIG. 4, the light of the incident energy I incident on the pixel 101 is collected by the microlens ML, transmitted through the wiring layer W, and incident on the silicon substrate Si. In this case, the incident energy of the light incident on a predetermined region 110a on a first surface FS of the silicon substrate Si is defined to be A. In FIG. 4, the predetermined region 110a is a region defined by perpendicularly projecting an aperture (light transmission region), which is defined by wiring Wi formed in the wiring layer W, to the silicon substrate Si.

The incident energy in a predetermined region 110b inside the silicon substrate Si away from the first surface FS by the distance z in the thickness direction D (depth direction) is defined to be B(z). In this case, the thicknesses of the microlens ML and the wiring layer W, and the width of the wiring Wi are determined so as to satisfy Formula (2). For example, if the thickness of the microlens ML, i.e., the aspect ratio of the microlens ML, is small, incident light may be reflected by the wiring Wi and the incident energy A of the incident light does not necessarily satisfy Formula (2). Therefore, the microlens ML is required to have a thickness (aspect ratio) that is suitably set to satisfy Formula (2).

Herein, the absorption coefficient of the silicon substrate Si when the average wavelength of the light source, not shown, is $\lambda$, is defined to be $\alpha(\lambda)$. In this case, when the distance z0 is defined according to Formula (1), Formula (3) is ensured to be satisfied. The distance z0 is a solution of exp$(-\alpha(\lambda) * z) = 0.5$ and represents the depth where the light perpendicularly incident on the surface of the silicon substrate Si attenuates by half. Therefore, the incident energy in a predetermined region 110c inside the silicon substrate Si away from the first surface FS by the distance z0 in the thickness direction D (depth direction) is represented by B(z0).

Figure 5:
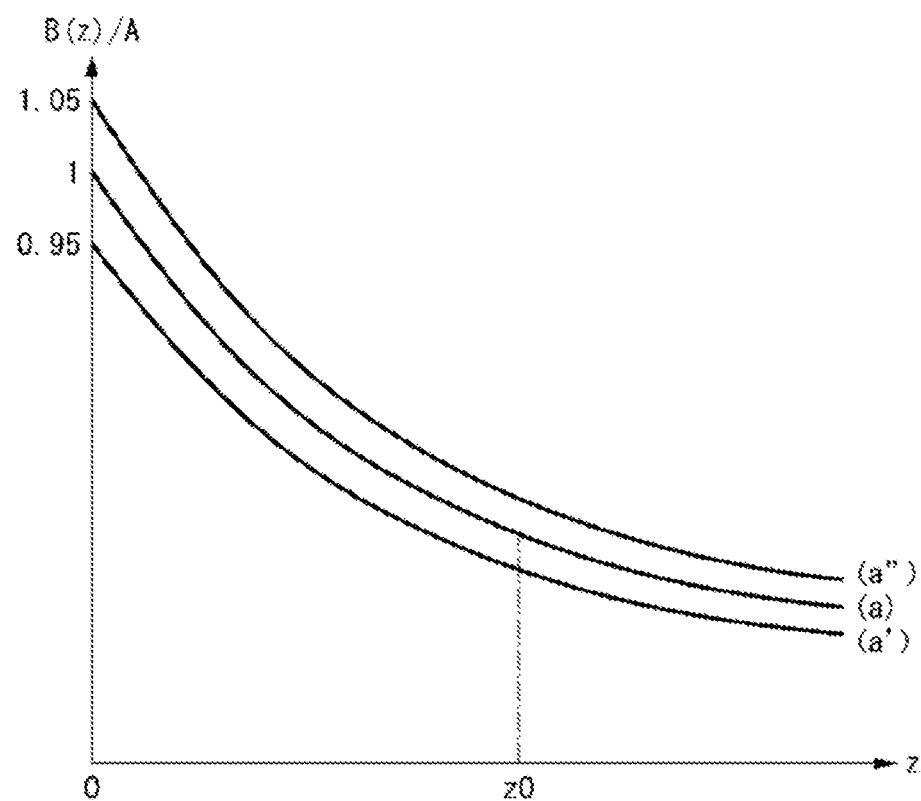
FIG. 5 is a graph illustrating energy attenuation of light incident on an image sensing device in which photoelectric conversion elements according to an embodiment of the present invention are formed.

FIG. 5 is a graph illustrating attenuation of incident energy of light (light in the near infrared wavelength band) incident on an image sensing device (range imaging sensor 10) in which the photoelectric conversion elements (pixels 101) according to an embodiment of the present invention are formed. When absorption of incident light in the silicon substrate Si is considered, theoretically, incident energy B(z)/A will not exceed $\exp(-\alpha(\lambda) * z)$. The incident energy B(z)/A becomes $\exp(-\alpha(\lambda) * z)$ in the case where incident light does not leak at all from a side surface 120a and a side surface 120b of the predetermined regions. In this case, the incident energy B(z)/A will be an exponential as indicated by the solid line (a) in FIG. 5.

The semiconductor region configured by the second conductive type semiconductor (N type semiconductor), which is formed in the silicon substrate Si as a semiconductor substrate configured by the first conductive type semiconductor (P type semiconductor), is generally formed in a region including the predetermined regions 110a to 110c. Specifically, in the predetermined regions 110a to 110c, high built-in electric fields are formed due to bonding of the first semiconductor region of the first conductive type semiconductor (P type semiconductor) with the second semiconductor region of the second conductive type semiconductor (N type semiconductor). Therefore, in order to achieve high-speed transfer of electrons after photoelectric conversion, the photoelectric conversion element (pixel 101) is preferred to be designed so that attenuation of the incident energy (B(z)/A at the maximum intensity of light incident on the predetermined regions 110a to 110c matches the solid line (a) indicated in FIG. 5. It should be noted that the solid line (a) in FIG. 5 indicates ideal attenuation. The actual characteristics of the photodiode PD are unlikely to exactly match the solid line (a) indicating the characteristics obtained through simulation, due to variation in dimension, such as the thicknesses of the microlens ML and wiring layer W, and the width of the wiring Wi, configuring the pixel 101, or due to variation in optical constants and the like of the microlens ML. Therefore, for example, as shown in FIG. 5, an error of 5% may be assumed between the characteristics of the actual photodiode PD and the characteristics of the photodiode PD in simulation. Thus, the incident energy $B(z)/A=0.95*exp(-\alpha(\lambda)*z)$ indicated by the solid line (a') in FIG. 5 is taken to be a lower limit, while the incident energy $B(z)/A=1.05*exp(-\alpha(\lambda)*z)$ indicated by the solid line (a") in FIG. 5 is taken to be an upper limit. Specifically, Formula (3) assumes an error of 5% between the characteristics of the actual photodiode PD and the characteristics of the photodiode PD in simulation.

In the above description, the incident energy $B(z)/A$ is defined to have a theoretical value of $exp(-\alpha(\lambda)*z)$ in the case where incident light does not leak at all from the side surfaces 120a and 120b of the predetermined regions. However, more strictly, this theoretical value is a numerical value in the case where the incident light on the predetermined regions 110a to 110c is collimated light that is perpendicularly incident on the pixel 101. Accordingly, when the light collected by a microlens ML as in the pixel 101 is defined to be incident light, the incident energy $B(z)/A$ will be smaller than $exp(-\alpha(\lambda)*z)$. However, theoretical value variance based on the reasons stated above are likely to be small. Therefore, even if variance in incident energy $B(z)/A$ due to variance in incident light is neglected when obtaining the characteristics of the photodiode PD through simulation, there is unlikely to be any effect on the characteristics to be obtained of the photodiode PD.

It should be noted that, in each photodiode PD, the incident energy $B(z)$ in the region 110b which is a distance z from the first surface FS in the thickness direction D (depth direction) is ensured to be the incident energy $B(z0)$. In other words, in the photodiode PD, the depth of the region 110b is ensured to be a depth where the light perpendicularly incident on the front surface of the silicon substrate Si attenuates by half Specifically, the distance z is ensured to be the distance z0 (distance z=distance z0). In this case, Formula (3), when Formula (1), i.e., $exp(-\alpha(\lambda)*z0)=0.5$, is substituted into it, can be expressed by the following Formula (5).

$$\forall z[z=z0 \Rightarrow 0.475 \leq B(ln(2)/\alpha(\lambda))/A \leq 0.525] \quad (5)$$

Accordingly, when forming the photodiode PD configuring each pixel 101, doping control for impurities serving as the N type semiconductor is performed so that the relational expressions of Formulas (2) and (5) will be established.

According to the concepts described above, the N type semiconductor regions of the respective photodiodes PD configuring the plurality of pixels 101 are formed in the range imaging sensor 10. Thus, in the range imaging sensor 10, the depth, in particular, of the N type semiconductor region configuring the photodiode PD in each of the plurality of pixels 101 becomes deeper than the N type semiconductor region in each of the photodiodes formed in generally used front side illumination type image sensors. Thus, in the range imaging sensor 10, sensitivity to light in the near infrared wavelength band can be improved in the photodiode PD configuring each of the plurality of pixels 101.

<Aspect Ratio of Microlens ML>

Further, as described above, in the range imaging sensor 10, the thickness (aspect ratio) of the microlens ML is determined so as to satisfy Formula (2) in order to cause light in the near infrared wavelength band incident on each of the plurality of pixels 101 to reach the N type semiconductor region which is formed extending to a position deep in the silicon substrate Si, i.e., in order to have electrons generated in the N type semiconductor region in response to the light in the near infrared wavelength band. The distance (depth) in the optical axis direction through which the light in the near infrared wavelength band collected by the microlens ML can travel can be obtained through simulation. A suitable thickness (aspect ratio) satisfying Formula (2) for the microlens ML formed in each of the pixels 101 in the range imaging sensor 10 can be determined by performing simulation for generally used optical lenses.

In the simulation of optical lenses, several parameters are set, including the structure of the pixel 101, the shape of the microlens ML, and the characteristics of the materials forming the pixel 101 and the microlens ML with respect to light. Parameters set in the simulation of optical lenses for the structure of the pixel 101 or the shape of the microlens ML may be, for example, pixel size of the pixel 101, height of the microlens ML, thickness of the wiring layer W in the pixel 101, and the like. Parameters set in the simulation of optical lenses for the characteristics of the materials may be, for example, refractive index with respect to light and extinction coefficient in the materials of the microlens ML, the wiring layer W, the wiring Wi, and the like. Through simulation of optical lenses by setting these parameters, variation in the intensity of incident light (light in the near infrared wavelength band) in the thickness direction (depth direction) of the silicon substrate Si can be obtained, and an aspect ratio of the microlens ML can be determined.

Figure 6:
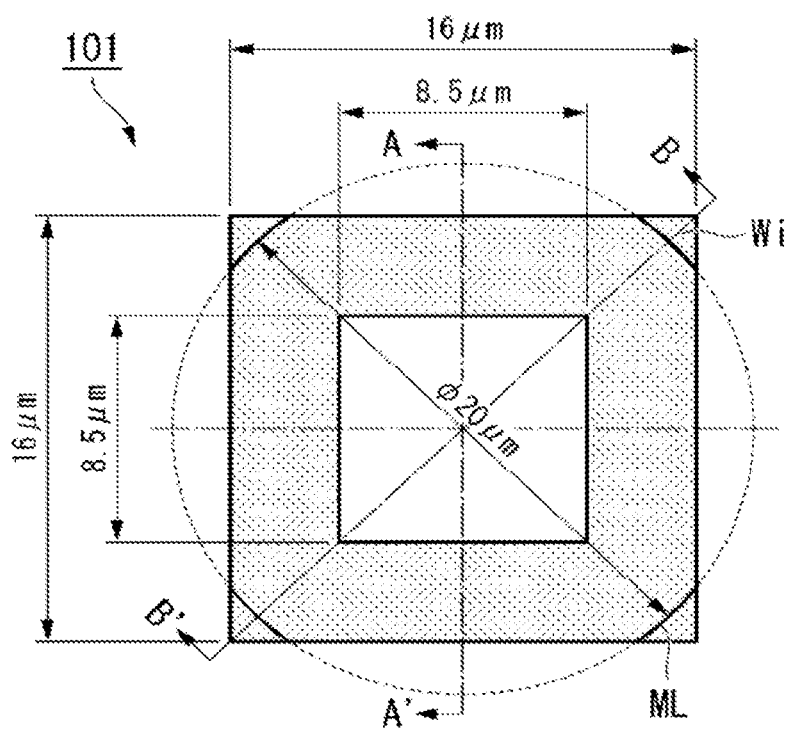
FIG. 6 is a diagram illustrating parameters for simulation performed when forming microlenses in an image sensing device in which photoelectric conversion elements according to an embodiment of the present invention are formed.
Figure 7A:
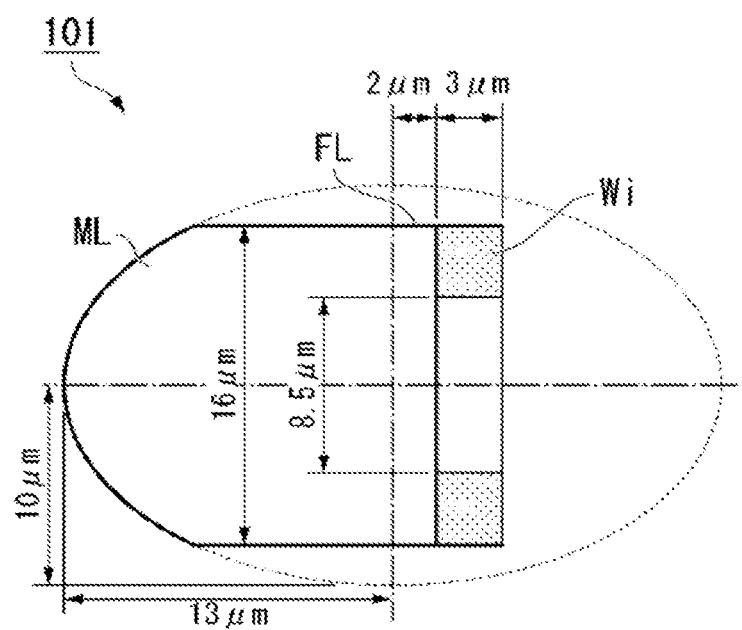
FIG. 7A is a diagram illustrating parameters for simulation performed when forming microlenses in an image sensing device in which photoelectric conversion elements according to an embodiment of the present invention are formed.
Figure 7B:
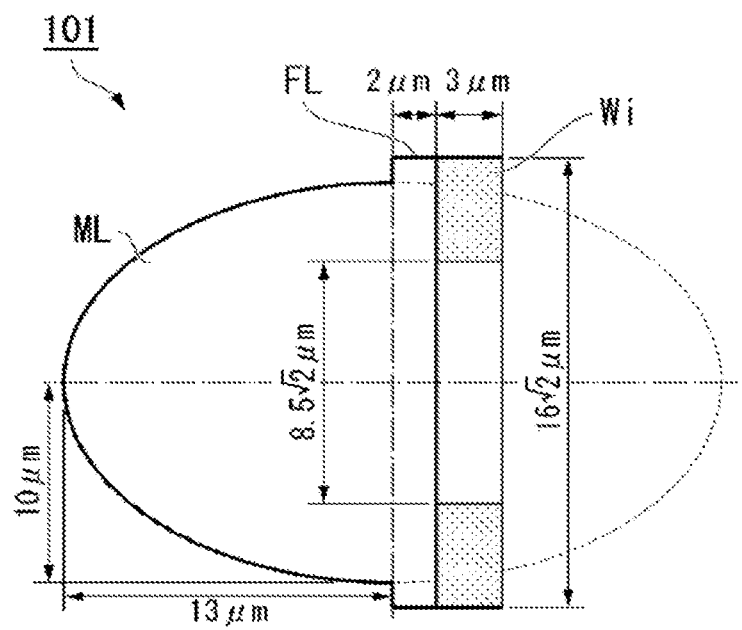
FIG. 7B is a diagram illustrating parameters for simulation performed when forming microlenses in an image sensing device in which photoelectric conversion elements according to an embodiment of the present invention are formed.

An example of simulation in the case of changing the thickness (aspect ratio) of the microlens ML will be described. First, parameters for simulation will be described. FIGS. 6, 7A and 7B are diagrams illustrating parameters for simulation performed when forming microlenses ML in an image sensing device (range imaging sensor 10) in which photoelectric conversion elements (pixels 101) according to an embodiment of the present invention are formed. FIGS. 6, 7A and 7B each show one pixel 101 arranged in the range imaging sensor 10. FIG. 6 is a plan view of the pixel 101 as viewed in the light incident direction. FIGS. 7A and 7B are cross-sectional views of the pixel 101 shown in FIG. 6 when it is viewed in the lateral direction. More specifically, FIG. 7A is a cross-sectional view taken along the line A-A' in the plan view of the pixel 101 shown in FIG. 6. FIG. 7B is a cross-sectional view taken along the line B-B' in the plan view of the pixel 101 shown in FIG. 6.

FIGS. 6, 7A and 7B show an example of a pixel 101 having a size of 16 μm square, and an aperture of 8.5 μm square. It should be noted that, for ease of simulation, FIGS. 6, 7A and 7B show the case where the wiring Wi as a single piece of aluminum (Al) is present in the region throughout the depth direction thereof, except for the aperture. In the pixel 101 with this configuration, the case where the microlens ML has a diameter of 20 μm (φ20 μm) is assumed. In the pixel 101, as shown in FIGS. 7A and 7B, a flattening layer FL is formed on the front surface of the wiring layer W in which the wiring Wi is formed, i.e., the light incident side surface of the wiring layer W through which light enters the pixel 101, and the microlens ML is formed on the flattening layer FL, i.e., on the light incident side surface thereof through which light enters the pixel 101. The flattening layer FL serves as a foundation (underlayer) of the microlens ML in the microlens layer L and forms a part of the microlens ML. Therefore, while the flattening layer FL has a predetermined thickness, the distance (depth) through which the light in the near infrared wavelength band collected by the microlens ML travels, in the optical axis direction, depends on the sum of the thickness of the microlens ML and the thickness of the flattening layer FL from the front surface of the wiring layer W, that is, the height (thickness) of these components in the optical axis direction.

As shown in FIGS. 7A and 7B, the shape of the microlens ML can be taken to be a part of an ellipse. FIGS. 7A and 7B show the case where a part of an ellipse of φ20 μm, i.e, having a minor axis of 20 μm and a major axis of 26 μm, is the shape of the microlens ML. It should be noted that FIGS. 7A and 7B show a value of 10 μm that is a half the length of the minor axis (semi-minor axis) and a value of 13 μm that is a half the length of the major axis (semi-major axis) in the ellipse which can be considered to be a microlens ML. The height of the microlens ML is a height from the front surface of the flattening layer FL on which light is incident. In FIGS. 7A and 7B, the minor axis of the ellipse is parallel to the front surface of the flattening layer FL. In the case of the pixel 101 shown in FIGS. 7A and 7B, the height of the microlens ML is the length of the semimajor axis, i.e., 13 μm. The aspect ratio of the microlens ML can be calculated from the values representing the ellipse based on the following Formula (6).

$$\text{Aspect ratio of microlens } ML = \text{Height of microlens } ML / \text{Diameter of microlens } ML \qquad (6)$$
$$= \text{Semi-major axis/Minor axis}$$
$$= 13 \ \mu m/20 \ \mu m$$
$$= 0.65$$

In the case of forming a microlens ML of φ20 μm on a pixel 101 of 16 μm square, as shown in FIG. 6, portions of the microlens ML would protrude from the pixel 101 on the sides in the vertical direction (longitudinal direction in FIG. 6) of the pixel 101 and the sides in the horizontal direction (lateral direction in FIG. 6) thereof. The portions of the microlens ML protruding from the pixel 101 would overlap with portions of the microlenses ML protruding from the adjacent pixels 101. Furthermore, as shown in FIG. 6, the pixel 101 has portions in the diagonal line direction thereof (diagonal 45° direction in FIG. 6) where the microlens ML is not formed. The portions where microlens ML is not formed are configured by only the flattening layer FL. In FIGS. 7A and 7B, the flattening layer FL serving as a foundation of the microlens ML is designed to have a height (thickness) of 2 μm in the optical axis direction. It should be noted that the thickness of the flattening layer FL is a predetermined thickness (2 μm herein) regardless of the height of the microlens ML. Furthermore, in FIGS. 7A and 7B, the wiring layer W configuring the pixel 101 in the region except for the aperture is designed to have a height of 3 μm. It should be noted that the portions of the microlens ML which would overlap with portions of the microlenses ML on the adjacent pixels 101 may be increased so that there would be no portions in the pixel 101 where the microlens ML is not formed. In other words, the diameter of the microlens ML may be increased to eliminate the portions where only the flattening layer FL is formed.

Figure 8:
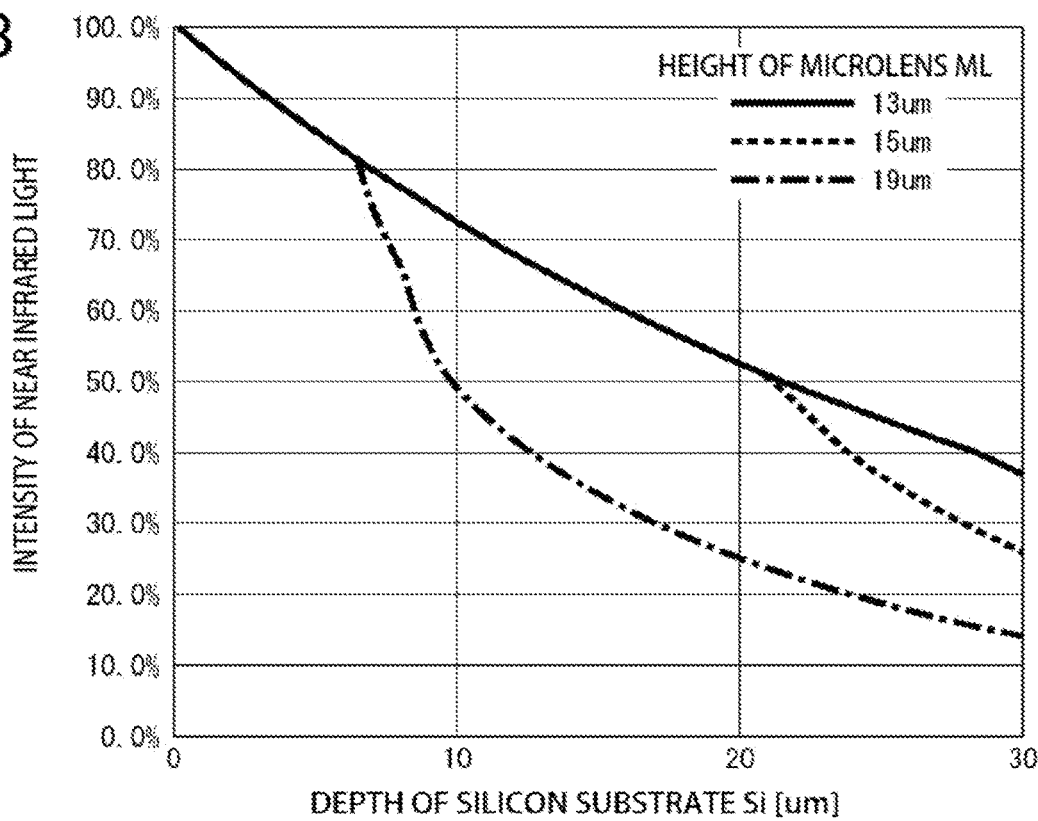
FIG. 8 is a graph illustrating an example of simulation results showing energy attenuation of light incident on an image sensing device in which photoelectric conversion elements according to an embodiment of the present invention are formed.

A description will now be given of an example of simulating variation in the intensity of incident light in the near infrared wavelength band in the thickness direction (depth direction) of the silicon substrate Si in the pixel 101 on which the microlens ML having such a configuration is formed. FIG. 8 is a graph illustrating an example of simulating attenuation of incident energy of light (light in the near infrared wavelength band) incident on an image sensing device (range imaging sensor 10) in which the photoelectric conversion elements (pixels 101) according to an embodiment of the present invention are formed. The graph in FIG. 8 shows variation in the intensity of the near infrared light with relative values through simulation of intensity attenuation of the near infrared light having a wavelength of 940 nm according to the depth of the silicon substrate Si, in the structure of the pixel 101 and the shape of the microlens ML shown in FIGS. 6, 7A and 7B.

It should be noted that, when performing simulation, the refractive index of light in the silicon substrate Si, i.e., silicon (Si), is taken to be 3.59. The refractive index of light in the material of the microlens ML (including the flattening layer FL) is taken to be 1.6. The refractive index of light in aluminum (Al) used for forming the wiring Wi is taken to be 1.66. The refraction index of light in carbon dioxide silicon ($SiO_2$) as an insulating material used for forming the wiring layer W including the aperture and the like in the pixel 101 is taken to be 1.46. Also, for performing simulation, the extinction coefficient of light in silicon (Si) is taken to be 0.01, and that in aluminum is taken to be 8.71.

Furthermore, for comparison, FIG. 8 also indicates the case where the height of the microlens ML is 15 μm (aspect ratio=0.75) and the case where it is 19 μm (aspect ratio=0.95). It should be noted that, if the height of the microlens ML is changed due to the change in aspect ratio of the microlens ML, there will be a change in height (thickness) in the optical axis direction in portions of the microlens ML which would overlap with portions of the microlenses MIL on the adjacent pixels 101, i.e., the height (thickness) of these portions in the optical axis direction except for the flattening layer FL. Furthermore, if there is a change in height (thickness) in the optical axis direction in these portions of the microlens ML which would overlap with portions of the microlenses ML on the adjacent pixels 101, there will also be a change in the amount of light leaked from the adjacent pixels 101, i.e., the amount of light leaked from the surrounding pixels 101 (the adjacent pixels located in the longitudinal and lateral directions (i.e., the vertical direction V and the horizontal direction H) in the pixel array shown in FIG. 1) located around the pixel 101 as a target of simulation. The simulation shown in FIG. 8 takes into account the height (thickness) in the optical axis direction in these portions of the microlens ML which would overlap with portions of the microlenses ML on the adjacent pixels 101 and the amount of leakage of light, as a result of changing the aspect ratio of the microlens ML. In other words, the simulation shown in FIG. 8 includes change in parameters as a result of changing the height of the microlens ML (aspect ratio of the microlens ML).

As shown in FIG. 8, when the height of the microlens ML is 13 μm (aspect ratio=0.65), the intensity of the near infrared light having a wavelength of 940 nm exponentially lowers with respect to the depth of the silicon substrate Si. In contrast, when the height of the microlens ML is 15 μm (aspect ratio=0.75), the intensity of the near infrared light exponentially lowers with respect to the depth of the silicon substrate Si as in the case where the height of the microlens ML is 13 μm, until the depth of the silicon substrate Si reaches, for example, around 20 µm corresponding to the distance z0 shown in FIG. 4. Furthermore, in this case, the intensity of the near infrared light drastically lowers from when the depth of the silicon substrate Si has exceeded around 20 µm. Also, when the height of the microlens ML is 19 µm (aspect ratio=0.95), the intensity of the near infrared light drastically lowers from when the depth of the silicon substrate Si has reached around 6 µm to 7 µm.

The simulation shows that the cause of the drastic lowering in intensity of the near infrared light when the microlens ML has a height of 15 µm or 19 µm is the increase in diffused near infrared light beyond the light focus point, i.e., focus position, of the microlens ML due to the excessive increase in aspect ratio of the microlens ML. Diffusion of the near infrared light beyond the light focus position causes reduction of the efficiency of generating electrons in the N type semiconductor region formed extending to a position deep in the silicon substrate Si, i.e., causes reduction of sensitivity to light in the near infrared wavelength band in the photodiode PD. Therefore, in the example of the simulation shown in FIG. 8, it can be said that a suitable thickness (aspect ratio) of the microlens ML in the structure of the pixel 101 shown in FIGS. 6, 7A and 7B is 13 µm (aspect ratio=0.65).

When determining the thickness (aspect ratio) of the microlens ML practically satisfying Formula (2), the parameters of simulation may be set with high accuracy. However, as shown in FIG. 8, even in the case where the parameters of simulation are simply set, intensity attenuation, i.e., intensity change, of the near infrared light with respect to the depth of the silicon substrate Si is recognizable.

Figure 9A:
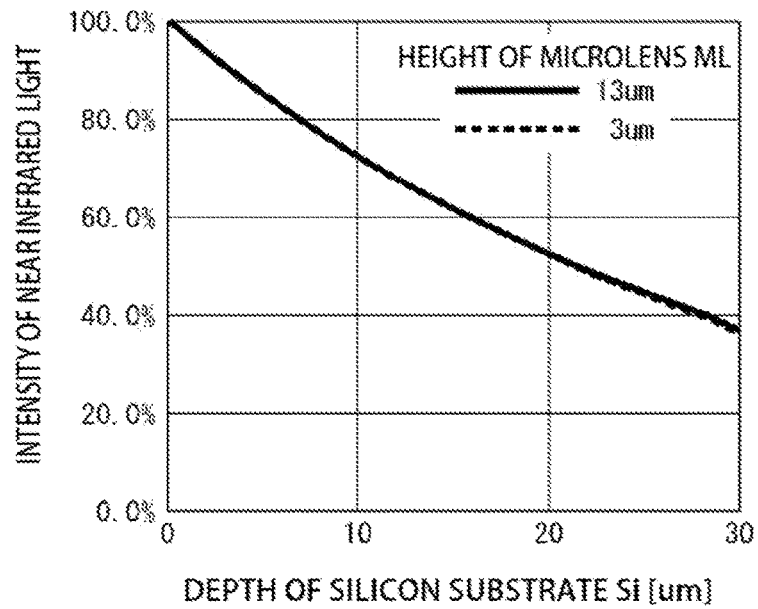
FIG. 9A is a graph illustrating an example of simulation results for comparison of energy attenuation of light incident on an image sensing device.
Figure 9B:
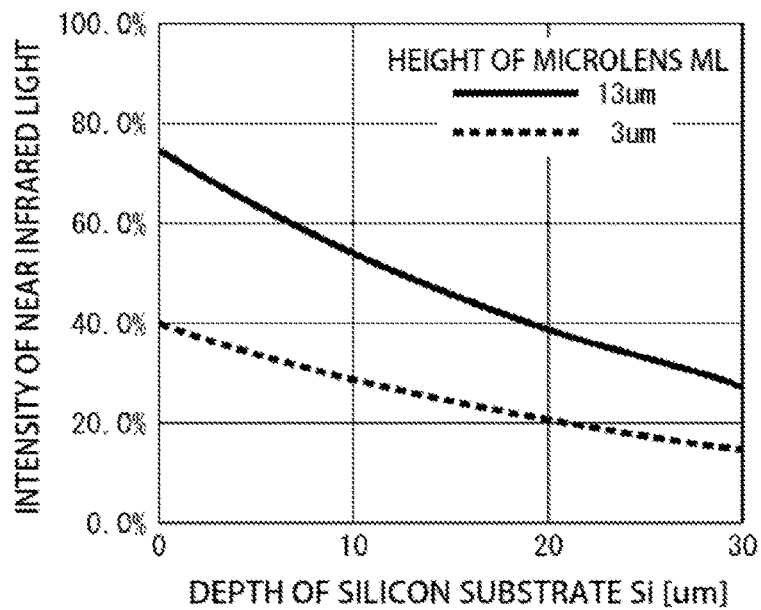
FIG. 9B is a graph illustrating an example of simulation results for comparison of energy attenuation of light incident on an image sensing device.

Next, for comparison, a description will be given of an example showing change in light intensity in the thickness direction (depth direction) of the silicon substrate Si due to the difference in height of the microlens ML, between the microlens ML formed on a pixel of generally used front side illumination type image sensors, and the microlens ML formed on the pixel 101 of the range imaging sensor 10 according to the present embodiment. FIGS. 9A and 9B are graphs showing examples of simulations for comparing attenuation in incident energy of light that is incident on an image sensing device. The graphs of FIGS. 9A and 9B each show the simulation shown in FIG. 8 together with a simulation in the case where the height of the microlens MIL is that of the microlens formed on a pixel of generally used image sensors. Specifically, FIGS. 9A and 9B each show simulations for intensity attenuation of the near infrared light having a wavelength of 940 nm with the depth of the silicon substrate Si. FIG. 9A shows a graph in which change in intensity of the near infrared light relative to the depth of the silicon substrate Si is represented by relative values, while FIG. 9B shows a graph in which change in intensity of the near infrared light relative to the depth of the silicon substrate Si is represented by absolute values.

In the simulations shown in FIGS. 9A and 9B, the height of the microlens ML formed on the pixel 101 is 13 µm (aspect ratio=0.65), and the height of the microlens formed on a pixel used for generally used image sensors is 3 µm (aspect ratio=0.15). In the simulations shown in FIGS. 9A and 9B, parameters except for the height of the microlens ML are the same as those for the simulations shown in FIG. 8.

As shown in FIG. 9A, change in intensity of the near infrared light with respect to the depth of the silicon substrate Si, when the change is represented by relative values, is similar between the case where the height of the microlens ML is 13 µm (aspect ratio=0.65) and the case where the height of the microlens is 3 µm (aspect ratio=0.15). Specifically, whether the height of the microlens ML is 13 µm or 3 µm, the intensity of the near infrared light having a wavelength of 940 nm similarly exponentially lowers with respect to the depth of the silicon substrate Si.

However, as shown in FIG. 9B, when change in intensity of the near infrared light is represented by absolute values, the intensity of the near infrared light in the case where the height of the microlens is 3 µm becomes much lower than the intensity of the near infrared light in the case where the height of the microlens ML is 13 µm More specifically, if the intensity of the near infrared light incident on the pixel 101 is 100%, the intensity of the near infrared light at the front surface (first surface) of the silicon substrate Si on which light is incident is 70% or more in the case where the height of the microlens ML is 13 µm, but it is 40% in the case where the height of the microlens is 3 µm. This is because, in the case of the microlens having a height of 3 light collection of the microlens ML is low (light collection performance is low) due to the low aspect ratio thereof and thus near infrared light is highly attenuated in the region in the wiring layer W through which the light passes before reaching the first surface of the silicon substrate Si. Therefore, the amount of the near infrared light that reaches the first surface of the silicon substrate Si in the case where the height of the microlens is 3 µm becomes smaller compared to the case where the height of the microlens is 13 µm, and thus the intensity lowers accordingly.

As described above, in the pixel 101, the N type semiconductor region of the photodiode PD is required to be formed extending to a position deep in the silicon substrate Si and determine the thickness (aspect ratio) of the microlens ML so as to satisfy Formula (2). Specifically, in the pixel 101, incident energy A of light incident on a predetermined region (region corresponding to the aperture herein) in the first surface of the silicon substrate Si is required to be 50% or more of incident energy I of light incident on the pixel 101. Therefore, as can be recognized from the simulations shown in FIGS. 9A and 9B, the microlens ML having a small aspect ratio with a height of 3 µm formed on generally used image sensors does not satisfy Formula (2) and thus is not a microlens ML with a suitable thickness (aspect ratio) for the structure of the pixel 101.

Thus, in the range imaging sensor 10, it can be confirmed through simulation whether the thickness (aspect ratio) of the microlens ML is suitable for the pixel 101. Specifically, in the range imaging sensor 10, it can be confirmed through simulation whether the microlens ML formed on each of the plurality of pixels 101 has a suitable thickness (aspect ratio) for improving sensitivity to light in the near infrared wavelength band in the photodiode PD which is formed in the N type semiconductor region located at a position deeper than that of the N type semiconductor region provided to the photodiode formed in generally used front side illumination type image sensors.

Thus, in the range imaging sensor 10, sensitivity to light in the near infrared wavelength band can be improved in each of the plurality of pixels 101 by the depth of the N type semiconductor region configuring the photodiode PD and a suitable thickness (aspect ratio) of the microlens ML.

Thus, the imaging system according an embodiment of the present invention including the range imaging sensor 10 is capable of measuring a distance to an object with higher accuracy using the time-of-flight (TOF) technique. Hereinafter, the imaging system according to an embodiment of the present invention will be described.

Figure 10:
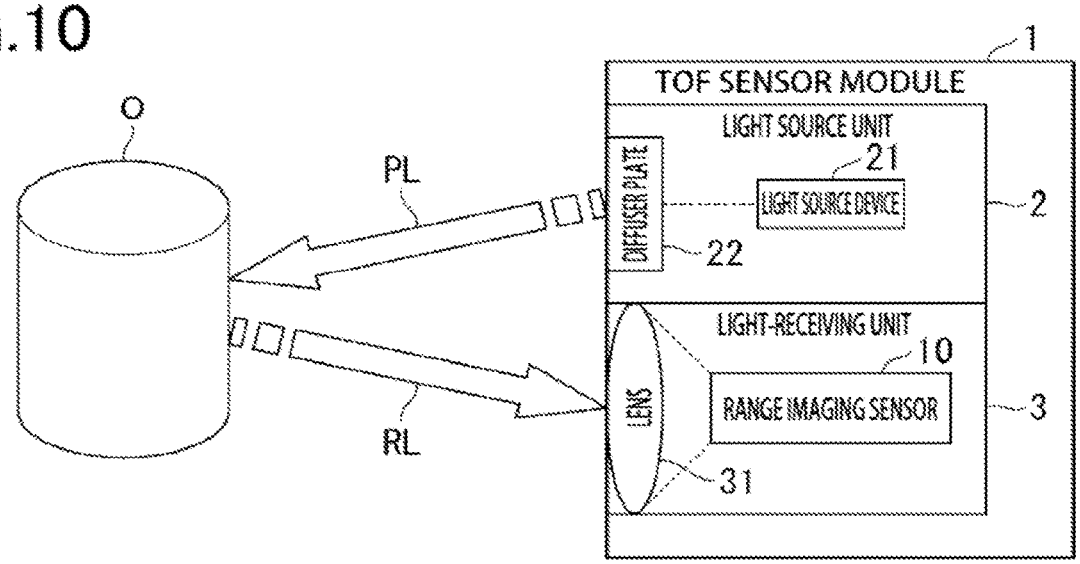
FIG. 10 is a schematic block diagram illustrating a configuration of an imaging system according to an embodiment of the present invention in which an image sensing device according to an embodiment of the present invention is provided.

FIG. 10 is a schematic block diagram illustrating a configuration of the imaging system according to an embodiment of the present invention in which the image sensing device (range imaging sensor 10) according to an embodiment of the present invention is installed. A TOF sensor module 1 shown in FIG. 10, which is the imaging system according to an embodiment of the present invention, includes a light source unit 2 and a light-receiving unit 3. The light source unit 2 includes a light source device 21 and a diffuser plate 22. The light-receiving unit 3 includes the range imaging sensor 10 and a lens 31. FIG. 10 also shows an object O for which a distance is measured by the TOF sensor module 1 that serves as the imaging system according to an embodiment of the present invention.

In the TOF sensor module 1 shown in FIG. 10, optical pulses PL in the near infrared wavelength band are applied to the object O from the light source unit 2. Then, in the TOF sensor module 1, the light-receiving unit 3 receives reflected light RL that is reflection of the optical pulses PL from the object O, and outputs a signal for measuring a distance to the object O (termed measurement signal hereinafter).

The light source unit 2 applies the optical pulses PL to the object O for which a distance is measured by the TOF sensor module 1. The light source unit 2 may be, for example, a surface emitting type semiconductor laser module such as a vertical cavity surface emitting laser (VCSEL). The light source device 21 is a light source that emits a laser beam in the near infrared wavelength band (e.g., the wavelength band of 850 nm to 940 nm) which serves as the optical pulses PL to be applied to the object O. The light source device 21 may be, for example, a semiconductor laser light emitting element. The light source device 21 emits a pulsed laser beam according to the control of a light source controller, not shown. The diffuser plate 22 is an optical lens that diffuses the laser beam in the near infrared wavelength band emitted from the light source device 21 to the breadth of the surface of the object O to be irradiated with the laser beam. The pulsed laser beam diffused by the diffuser plate 22 is emitted from the light source unit 2 as optical pulses PL and applied to the object O.

The light-receiving unit 3 receives the reflected light RL that is reflection of the optical pulses PL from the object O as a target, for which a distance is measured by the TOF sensor module 1, and outputs a measurement signal according to the received reflected light RL. The lens 31 is an optical lens that leads the incident reflected light RL to the range imaging sensor 10. The lens 31 outputs the incident reflected light RL toward the range imaging sensor 10, so that the light can be received by (incident on) the entire surface of the light-receiving region 100 provided to the range imaging sensor 10, i.e., the plurality of pixels 101 arranged in the light-receiving region 100.

With this configuration, in the TOF sensor module 1, the reflected light RL of the optical pulses PL in the near infrared wavelength band applied to the object O by the light source unit 2 and reflected therefrom is received by the light-receiving unit 3, and the range imaging sensor 10 provided to the light-receiving unit 3 outputs a measurement signal for measuring a distance to the object O.

It should be noted that, in the TOF sensor module 1, application of the optical pulses PL by the light source unit 2 and reception of the reflected light RL by the light-receiving unit 3 are performed, for example, by a module control unit, not shown, provided externally or internally to the TOF sensor module 1. More specifically, the module control unit, not shown, determines the period of the optical pulses PL applied to the object O from the light source unit 2, or the timing for the range imaging sensor 10 provided to the light-receiving unit 3 to receive the reflected light RL. Furthermore, the measurement signal outputted from the TOF sensor module 1 (more specifically, the range imaging sensor 10) is processed, for example, by a range image processor, not shown, provided externally or internally to the TOF sensor module 1, to produce a two-dimensional image including the object O and information on the distance to the object O. It should be noted that the range image processor, not shown, may produce a two-dimensional image including the object O (range image) in which, for example, the information on the distance to the object O is shown in different colors.

As described above, according to an embodiment of the present invention, the structure of a photoelectric conversion element (pixel) configuring each pixel arranged in the light-receiving region is provided as a structure suitable for light in the near infrared wavelength band, in the silicon substrate that will be an image sensing device (range imaging sensor). More specifically, when forming a photoelectric conversion element, the N type semiconductor region configuring the photoelectric conversion element is formed extending to a depth (thickness) position deeper than that of the N type semiconductor region configuring a photoelectric conversion element in a pixel of generally used front side illumination type image sensors. Thus, in the image sensing device according to an embodiment of the present invention, sensitivity to light in the near infrared wavelength band can be improved in the photoelectric conversion element configuring each of the plurality of pixels. In other words, the image sensing device according to an embodiment of the present invention is capable of outputting a signal more accurately representing the amount (intensity) of incident light in the near infrared wavelength band.

Furthermore, in an embodiment of the present invention, the imaging system (TOF sensor module 1) including the image sensing device is capable of outputting a signal more accurately representing the amount (intensity) of the light in the near infrared wavelength band outputted from the image sensing device. Thus, the imaging system including the image sensing device is capable of outputting a measurement signal that can measure a distance to an object with higher accuracy using the time-of-flight (TOF) technique.

The embodiments of the present invention have been described assuming that the image sensing device has a structure corresponding to that of a front side illumination type image sensor. However, the structure of the image sensing device is not limited to the structure corresponding to a front side illumination type image sensor as shown in the embodiments of the present invention. Specifically, generally used image sensors not only include front side illumination type image sensors, but also include back side illumination (BSI) type image sensors. Accordingly, the structure of the image sensing device can be formed into a structure corresponding to a back side illumination type image sensor. Even in the case where the structure of the image sensing device has a structure corresponding to that of a back side illumination type image sensor, the concepts of forming the photoelectric conversion element are the same as the concepts described in the embodiments of the present invention. The structure of the image sensing device in this case can be easily designed based on the structure of generally used back side illumination type image sensors. Therefore, detailed description is omitted of the case where the image sensing device has a structure corresponding to that of a back side illumination type image sensor.

Furthermore, the embodiments of the present invention have been described for the case where the configuration of each pixel arranged in the light-receiving region of the image sensing device is a configuration in which the signal charge generated and stored by the photoelectric conversion element is transferred and stored by combining one gate electrode G with one floating diffusion FD. However, the number of combinations of the gate electrode G and the floating diffusion FD included in each pixel arranged in the light-receiving region of the image sensing device is not limited to one as shown in the embodiments of the present invention. Specifically, each pixel arranged in the light-receiving region of the image sensing device may have a configuration including two or more combinations of the gate electrode G and the floating diffusion FD. Thus, in the image sensing device including pixels each provided with two or more combinations of the gate electrode G and the floating diffusion FD, the signal charge generated and stored by the photoelectric conversion element can be transferred being distributed to each individual floating diffusion FD for storage therein. Specifically, in the image sensing device in which pixels each provided with two or more combinations of the gate electrode G and the floating diffusion FD are arranged, highly sensitive signal charge generated and stored by the photoelectric conversion elements can be more effectively used. Therefore, the accuracy of measuring a distance using the time-of-flight (TOF) technique can be further improved by the imaging system including the image sensing device in which pixels each provided with two or more combinations of the gate electrode G and the floating diffusion FD are arranged.

Furthermore, the embodiments of the present invention have been described assuming that the photoelectric conversion element configuring each of the pixels arranged in the light-receiving region of the image sensing device is a photoelectric conversion element of a type in which electrons according to the amount (intensity) of incident light are generated and stored as signal charge. However, the photoelectric conversion element is not limited to the type in which electrons are generated and stored as signal charge as shown in the embodiments of the present invention. Specifically, the photoelectric conversion elements configuring the pixels arranged in generally used image sensors include not only those which generate electrons as signal charge, but also those which generate holes according to the amount (intensity) of incident light for storage as signal charge. Accordingly, the photoelectric conversion element can also serve as a photoelectric conversion element in which holes are generated and stored as signal charge. Even in the case where photoelectric conversion element serves as a photoelectric conversion element in which holes are generated and stored as signal charge, the concepts of forming the photoelectric conversion element are the same as the concepts described in the embodiments of the present invention. The structure of the photoelectric conversion element in this case can be easily designed, including a suitable conductive type for the semiconductor in the silicon substrate Si or the photodiode PD, by replacing electrons with holes in the description of the embodiments of the present invention. Therefore, detailed description is omitted of the case where the photoelectric conversion element is of the type in which holes are generated as signal charge.

Some embodiments of the present invention have been described so far with reference to the drawings. However, specific configurations are not limited to those of the embodiments, and various modifications not departing from the spirit of the present invention should also be encompassed by the present invention.

The present application addresses the following. In range imaging sensors, sensitivity of each of the plurality of pixels is associated with the structure of the photodiode as a light-receiving unit and, in particular, associated with the length thereof in the optical axis direction. Specifically, sensitivity of each of the plurality of pixels in range imaging sensors is also associated with the depth (thickness) of the diffusion layer when forming a photodiode in the silicon substrate. This is because, in range imaging sensors, the light that is reflection of optical pulses in the near infrared region is received from an object as mentioned above, and since this reflected light is also in the near infrared region, significant photoelectric conversion is performed at positions deep in the silicon substrate.

However, the technique disclosed in PTL 1 is a technique for forming microlenses at respective positions of the plurality of pixels in an image sensor. Therefore, although microlenses can be formed for respective pixels in a range imaging sensor by adopting the technique disclosed in PTL 1, the microlenses formed are not necessarily suitable for the range imaging sensor. This is because the focal position of each microlens formed using the technique disclosed in PTL 1 is located near the light-receiving surface of the pair of photogates, i.e., near the light-incident side surface of the semiconductor substrate in which the photogates are formed. As techniques related to range imaging sensors, there is no technique disclosed for formation of microlenses for the respective plurality of pixels, with definition of the relationship between the position where light is collected by a microlens, i.e., the focal position of a microlens, and the depth (thickness) of a diffusion layer when forming a photodiode as a light-receiving unit for each of the plurality of pixels.

The present invention has an aspect to provide a photoelectric conversion element with a structure capable of improving light sensitivity of each of a plurality of pixels, an image sensing device in which the photoelectric conversion elements are arranged, and an imaging system provided with the image sensing device, in a range imaging sensor in which microlenses are formed for the respective pixels.

In order to achieve the above issues, a photoelectric conversion element according to an aspect of the present invention is a photoelectric conversion element that receives reflected light reflected from an object, the reflected light arising from reflection of light emitted from a light source that emits light in a predetermined wavelength band. The photoelectric conversion element includes a substrate including a first surface that is a front surface on which the reflected light is incident, a first semiconductor region configured by a first conductive type semiconductor, and a second semiconductor region configured by a second conductive type semiconductor whose conductive type is different from that of the first conductive type semiconductor, the second semiconductor region being formed in a direction perpendicular to the first surface so as to extend from the first surface toward an inside of the substrate; and an optical element that is arranged on a first surface side of the substrate to collect the reflected light to the second semiconductor region. When I represents incident energy of the reflected light incident on the photoelectric conversion element, $\alpha(\lambda)$ represents an absorption coefficient of the reflected light in the substrate when an average wavelength of the light source is $\lambda$, A1 represents incident energy of the reflected light in a predetermined region on the first surface, A2 represents incident energy of the reflected light in the predetermined region on the first surface in the case where the photoelectric conversion element does not include the optical element, and B(z) represents incident energy of the reflected light in a region translated from the predetermined region by a predetermined distance z in a thickness direction of the substrate, and when A1≥A2 is satisfied and a distance z0=ln(2)/α(λ) is established, a relational expression 0.95*exp(−α(λ)*z)≤B(z)/A1≤1.05*exp(−α(λ)*z) is established at the distance z=z0.

In order to achieve the above issues, a photoelectric conversion element according to an aspect of the present invention is a photoelectric conversion element that receives reflected light reflected from an object, the reflected light arising from reflection of light emitted from a light source that emits light in a predetermined wavelength band. The photoelectric conversion element includes a substrate including a first surface that is a front surface on which the reflected light is incident, a first semiconductor region configured by a first conductive type semiconductor, and a second semiconductor region configured by a second conductive type semiconductor whose conductive type is different from that of the first conductive type semiconductor, the second semiconductor region being formed in a direction perpendicular to the first surface so as to extend from the first surface toward an inside of the substrate; and an optical element that is arranged on a first surface side of the substrate to collect the reflected light to the second semiconductor region. When I represents incident energy of the reflected light incident on the photoelectric conversion element, α(λ) represents an absorption coefficient of the reflected light in the substrate when an average wavelength of the light source is λ, A1 represents incident energy of the reflected light in a predetermined region on the first surface, A2 represents incident energy of the reflected light in the predetermined region on the first surface in the case where the photoelectric conversion element does not include the optical element, and B(z) represents incident energy of the reflected light in a region translated from the predetermined region by a predetermined distance z in a thickness direction of the substrate, and when A1≥A2 is satisfied and a distance z0=ln(2)/α(λ) is established, a relational expression 0.95*exp(−α(λ)*z)≤B(z)/A1≤1.05*exp(−α(λ)*z) is established for distances z satisfying 0≤z≤z0.

In the photoelectric conversion according to an aspect of the present invention, the predetermined region may be a region defined by perpendicularly projecting the second semiconductor region to the first surface.

In the photoelectric conversion according to an aspect of the present invention, the wavelength band may be a near infrared wavelength band.

In the photoelectric conversion according to an aspect of the present invention, the near infrared wavelength band may be a wavelength band in a range of 850 nm to 940 nm.

An image sensing device according to an aspect of the present invention receives reflected light reflected from an object, the reflected light arising from reflection of light emitted from a light source that emits light in a predetermined wavelength band, and includes a light-receiving region where a plurality of pixels are two-dimensionally arrayed in a matrix, the pixels being a plurality of the photoelectric conversion elements according to the above aspect. In the light-receiving region, the plurality of pixels are arrayed in a first direction and a second direction which are orthogonal to each other. When the optical elements are cut along the first direction and the second direction, a height of a trough between two adjacent optical elements is defined to be a first height. When the optical elements are cut along a diagonal line direction of the pixels, a height of a trough between two adjacent optical elements is defined to be a second height. The first height and the second height are different from each other.

An imaging system according to an aspect of the present invention includes a light source unit that emits light in a predetermined wavelength band, the image sensing device according to the above aspect, and a light-receiving unit that receives reflected light that is the light reflected from an object.

The imaging system according to an aspect of the present invention has advantageous effects of being able to provide photoelectric conversion elements each having a structure capable of improving light sensitivity of the corresponding one of a plurality of pixels, and an image sensing device in which the photoelectric conversion elements are arranged, in a range imaging sensor where microlenses are formed for the respective pixels, and provide an imaging system provided with the image sensing device.

REFERENCE SIGNS LIST

1 . . . TOF sensor module
2 . . . Light source unit
21 . . . Light source device
22 . . . Diffuser plate
3 . . . Light-receiving unit
31 . . . Lens
10 . . . Range imaging sensor
101 . . . Pixel (photoelectric conversion element)
Si . . . Silicon substrate
PD Photodiode (photoelectric conversion unit)
FD . . . Floating diffusion
G . . . Gate electrode
W Wiring layer
Wi . . . Wiring
FS . . . First surface
L Microlens layer
ML Microlens
FL . . . Flattening layer
e⁻ . . . Electron
PL . . . Optical pulse
RL . . . Reflected light
O . . . Object
110a, 110b, 110c . . . Region
120a, 120b . . . Side surface
I, A, B(z), B(z0) . . . Incident energy Obviously, numerous modifications and variations of the present invention are possible in light of the above teachings. It is therefore to be understood that within the scope of the appended claims, the invention may be practiced otherwise than as specifically described herein.

What is claimed is:

1. A photoelectric conversion element, comprising:
a substrate having a first surface on which reflected light reflected from an object is incident, and including a first semiconductor region and a second semiconductor region, the second semiconductor region being formed in a direction perpendicular to the first surface and extended from the first surface toward an inside of the substrate; and
an optical element positioned on a first surface side of the substrate and configured to collect the reflected light to the second semiconductor region,
wherein the first semiconductor region comprises a first conductive type semiconductor, the second semiconductor region comprises a second conductive type semiconductor whose conductive type is different from that of the first conductive type semiconductor, and the substrate and the optical element are configured such that a relational expression $0.95^*\exp(-\alpha(\lambda)^*z) \leq B(z)/A1 \leq 1.05^*\exp(-\alpha(\lambda)^*z)$ is established at a distance $z=z0$ when $A1 \geq A2$ is satisfied and a distance $z0=\ln(2)/\alpha(\lambda)$ is established, where I is incident energy of the reflected light incident on the photoelectric conversion element, $\alpha(\lambda)$ is an absorption coefficient of the reflected light in the substrate where $\lambda$ is an average wavelength of a light source, A1 is incident energy of the reflected light in a predetermined region on the first surface, A2 is incident energy of the reflected light in the predetermined region on the first surface in a case where the photoelectric conversion element does not include the optical element, and B(z) is incident energy of the reflected light in a region translated from the predetermined region by a predetermined distance z in a thickness direction of the substrate.

2. The photoelectric conversion element according to claim 1, wherein the predetermined region is defined by perpendicularly projecting the second semiconductor region to the first surface.

3. The photoelectric conversion element according to claim 1, wherein the light source emits light in a near infrared wavelength band.

4. The photoelectric conversion element according to claim 1, wherein the light source emits light in a wavelength range of 850 nm to 940 nm.

5. A photoelectric conversion element, comprising:

a substrate having a first surface on which reflected light reflected from an object is incident, and including a first semiconductor region and a second semiconductor region, the second semiconductor region being formed in a direction perpendicular to the first surface and extended from the first surface toward an inside of the substrate; and an optical element positioned on a first surface side of the substrate and configured to collect the reflected light to the second semiconductor region, wherein the first semiconductor region comprises a first conductive type semiconductor, the second semiconductor region comprises a second conductive type semiconductor whose conductive type is different from that of the first conductive type semiconductor, and the substrate and the optical element are configured such that a relational expression $0.95^*\exp(-\alpha(\lambda)^*z) \leq B(z)/A1 \leq 1.05^*\exp(-\alpha(\lambda)^*z)$ is established at a distance z satisfying $0 \leq z \leq z0$ when $A1 \geq A2$ is satisfied and a distance $z0=\ln(2)/\alpha(\lambda)$ is established, where I is incident energy of the reflected light incident on the photoelectric conversion element, $\alpha(\lambda)$ is an absorption coefficient of the reflected light in the substrate where $\lambda$ is an average wavelength of a light source, A1 is incident energy of the reflected light in a predetermined region on the first surface, A2 is incident energy of the reflected light in the predetermined region on the first surface in a case where the photoelectric conversion element does not include the optical element, and B(z) is incident energy of the reflected light in a region translated from the predetermined region by a predetermined distance z in a thickness direction of the substrate.

6. The photoelectric conversion element according to claim 5, wherein the predetermined region is defined by perpendicularly projecting the second semiconductor region to the first surface.

7. The photoelectric conversion element according to claim 5, wherein the light source emits light in a near infrared wavelength band.

8. The photoelectric conversion element according to claim 5, wherein the light source emits light in a wavelength range of 850 nm to 940 nm.

9. An image sensing device, comprising:

a plurality of pixels two-dimensionally formed in a matrix in a light-receiving region, each of the pixels including the photoelectric conversion element of claim 1, wherein the pixels are arrayed in a first direction and a second direction which are orthogonal to each other, and the optical elements are configured to have a first height and a second height different from each other, where the first height is a height of a trough between two adjacent optical elements in a cross section of the optical elements along the first direction and the second direction, and the second height is a height of a trough between two adjacent optical elements in a cross section of the optical elements along a diagonal line direction of the pixels.

10. An imaging system, comprising:

a light source that emits light in a wavelength band;

the image sensing device of claim 9; and a light-receiving device that receives light reflected from an object.

11. The imaging system according to claim 10, wherein the wavelength band is a near infrared wavelength band.

12. The imaging system according to claim 10, wherein the wavelength band is in a range of 850 nm to 940 nm.

13. An image sensing device, comprising:

a plurality of pixels two-dimensionally formed in a matrix in a light-receiving region, each of the pixels including the photoelectric conversion element of claim 5, wherein the pixels are arrayed in a first direction and a second direction which are orthogonal to each other, and the optical elements are configured to have a first height and a second height different from each other, where the first height is a height of a trough between two adjacent optical elements in a cross section of the optical elements along the first direction and the second direction, and the second height is a height of a trough between two adjacent optical elements in a cross section of the optical elements along a diagonal line direction of the pixels.

14. An imaging system, comprising:

a light source that emits light in a wavelength band;

the image sensing device of claim 13; and a light-receiving device that receives light reflected from an object.

15. The imaging system according to claim 14, wherein the wavelength band is a near infrared wavelength band.

16. The imaging system according to claim 14, wherein the wavelength band is in a range of 850 nm to 940 nm.

\* \* \* \* \*